(12) United States Patent
Lin et al.

(10) Patent No.: US 10,658,225 B2
(45) Date of Patent: May 19, 2020

(54) FINFET DEVICES AND METHODS OF FORMING THE SAME

(71) Applicant: Taiwan Semiconductor Manufacturing Co., Ltd., Hsinchu (TW)

(72) Inventors: Jih-Jse Lin, New Taipei (TW); Ryan Chia-Jen Chen, Chiayi (TW); Fang-Cheng Chen, Hsinchu (TW); Ming-Ching Chang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/874,889

(22) Filed: Jan. 19, 2018

(65) Prior Publication Data

US 2019/0229010 A1 Jul. 25, 2019

(51) Int. Cl.

| H01L 21/762 | (2006.01) |
|---|---|
| H01L 21/8234 | (2006.01) |
| H01L 21/764 | (2006.01) |
| H01L 27/088 | (2006.01) |
| H01L 21/3065 | (2006.01) |
| H01L 29/66 | (2006.01) |
| H01L 29/78 | (2006.01) |
| H01L 21/311 | (2006.01) |
| H01L 29/165 | (2006.01) |

(52) U.S. Cl.
CPC .... *H01L 21/76232* (2013.01); *H01L 21/3065* (2013.01); *H01L 21/764* (2013.01); *H01L 21/823431* (2013.01); *H01L 21/823481* (2013.01); *H01L 27/0886* (2013.01); *H01L 29/66545* (2013.01); *H01L 21/31144* (2013.01); *H01L 21/823437* (2013.01); *H01L 29/165* (2013.01); *H01L 29/665* (2013.01); *H01L 29/7848* (2013.01)

(58) Field of Classification Search
CPC ........... H01L 21/76232; H01L 21/3065; H01L 27/0886; H01L 21/823481; H01L 21/823431; H01L 21/764; H01L 21/31144; H01L 29/7848
See application file for complete search history.

(56) References Cited

U.S. PATENT DOCUMENTS

| 8,796,666 B1 | 8/2014 | Huang et al. |
|---|---|---|
| 8,815,712 B2 | 8/2014 | Wan et al. |
| 8,963,258 B2 | 2/2015 | Yu et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |

(Continued)

*Primary Examiner* — Thanh Y. Tran
(74) *Attorney, Agent, or Firm* — JCIPRNET

(57) ABSTRACT

FinFET devices and methods of forming the same are disclosed. One of the FinFET devices includes first fins, second fins, a first gate strip, a second gate strip and a comb-like insulating structure. The first and second fins are disposed on a substrate. The first gate strip is disposed across the first fins. The second gate strip is disposed across the second fins. The comb-like insulating structure is disposed between the first gate strip and the second gate strip and has a plurality of comb tooth parts. In some embodiments, each of the comb tooth parts has a middle-wide profile.

12 Claims, 18 Drawing Sheets

(56) References Cited

U.S. PATENT DOCUMENTS

| | | |
|---|---|---|
| 9,520,482 B1 | 12/2016 | Chang et al. |
| 9,548,303 B2 | 1/2017 | Lee et al. |
| 9,576,814 B2 | 2/2017 | Wu et al. |
| 2017/0077229 A1* | 3/2017 | Hsu .................... H01L 29/0847 |

* cited by examiner

FINFET DEVICES AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of manufacturing ICs and, for these advances to be realized, similar developments in IC manufacturing are needed. For example, a three dimensional transistor, such as a fin-type field-effect transistor (FinFET), has been introduced to replace a planar transistor. Although existing FinFET devices and methods of forming FinFET devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

FIG. 2A to FIG. 2I are schematic cross-sectional views of a method of forming a FinFET device in accordance with some embodiments.

DETAILED DESCRIPTION

Figure 1A:
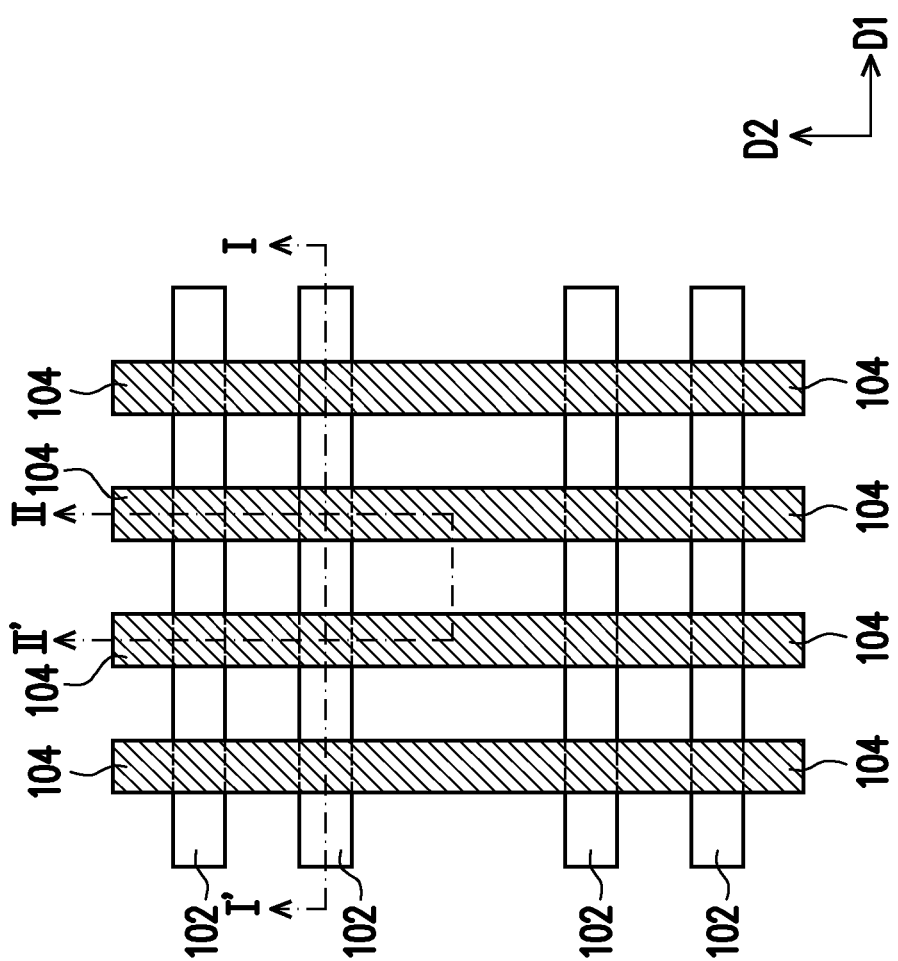
FIG. 1A to FIG. 1D are simplified top views of a method of forming a FinFET device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1D are simplified top views of a method of forming a FinFET device in accordance with some embodiments, in which few elements such as fins, dummy strips, insulating structures and gate strips are shown for simplicity and clarity of illustration. FIG. 2A to FIG. 2I are schematic cross-sectional views of a method of forming a FinFET device in accordance with some embodiments, some of which are taken along the lines I-I' and II-II' of FIG. 1A to FIG. 1D.

Figure 2A:
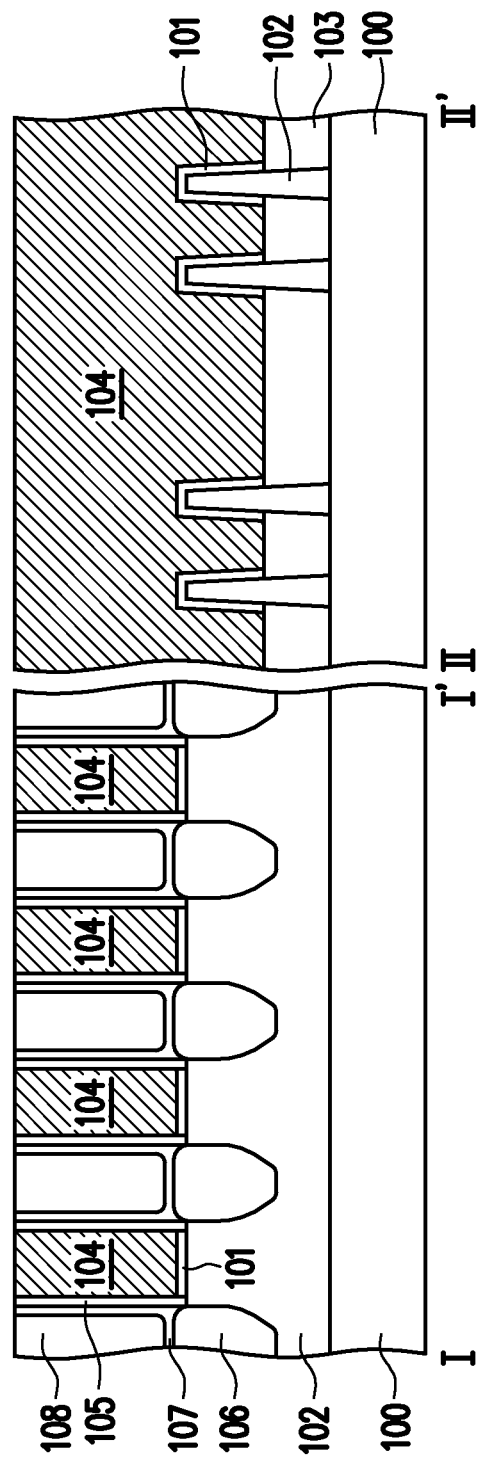

Referring to FIG. 2A, a substrate 100 with multiple fins 102 thereon is provided. In some embodiments, the substrate 100 is a semiconductor substrate, such as a silicon substrate, a silicon-on-insulator (SOI) substrate, a silicon germanium substrate, or a substrate formed of other suitable semiconductor materials. Depending on the requirements of design, the substrate 100 may be a P-type substrate or an N-type substrate and may have doped regions therein. The doped regions may be configured for an N-type FinFET device or a P-type FinFET device. In some embodiments, the fins 102 extend in a first direction D1, as shown in FIG. 1A.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In some embodiments, the method of forming the substrate 100 with the fins 102 includes forming a mask layer on a bulk substrate, and removing a portion of the bulk substrate by using the mask layer as an etch mask. In alternative embodiments, the method of forming the substrate 100 with fins 102 includes performing a sidewall image transfer (SIT) technique. In some embodiments, the fins 102 are formed with an inclined sidewall, as shown in FIG. 2A, but the present disclosure is not limited thereto. In alternative embodiments, the fins 102 can be formed with a substantially vertical sidewall.

Still referring to FIG. 2A, the substrate 100 further has an isolation layer 103 formed thereon. In some embodiments, the isolation layer 103 covers lower portions of the fins 102 and exposes upper portions of the fins 102. In some embodiments, the isolation layer 103 is a shallow trench isolation (STI) structure. The isolation layer 103 includes a dielectric material such as silicon oxide. The method of forming the isolation layer 103 includes forming an isolation material layer covering the fins 102, and removing a portion of the isolation material layer with chemical mechanical polishing (CMP) and/or etching back.

In some embodiments, the fins 102 and the substrate 100 are made of the same material, such as silicon. In alternative embodiments, the fins 102 include a material different from that of the substrate 100. For example, the fins 102 include silicon germanium and the substrate 100 includes silicon.

Continue referring to FIG. 2A, multiple dummy strips 104 are formed on the substrate 100 across the fins 102. In some embodiments, a dummy layer is formed on the substrate 100 covering the fins 102 and the isolation layer 103, and is then patterned by photolithography etching processes. The dummy layer may include a silicon-containing material such as polysilicon, amorphous silicon or a combination thereof. In some embodiments, the dummy strips 104 extend in a second direction D2 different from (e.g., perpendicular to) the first direction D1, as shown in FIG. 1A. In some embodiments, an interfacial layer 101 is formed between each dummy strip 104 and the corresponding fin 102, and the interfacial layer 101 includes silicon oxide, silicon oxynitride or a combination thereof.

Thereafter, spacers 105 are formed aside the dummy strips 104. In some embodiments, a spacer material layer is formed on the isolation layer 103 covering the dummy strips 104, and an anisotropic etching process is performed to remove a portion of the spacer material layer. In some embodiments, the spacer material layer includes SiN, SiCN, SiOCN, SiOR (wherein R is an alkyl group such as $CH_3$, $C_2H_5$ or $C_3H_7$), SiC, SiOC, SiON, a combination thereof or the like. Upon the anisotropic etching process, the spacers 105 extending in the second direction D2 are respectively formed on the sidewalls of the dummy strips 104.

Afterwards, multiple strained layers 106 are formed in the fins 102 aside the dummy strips 104. In some embodiments, recesses are formed in the fins 102, and the strained layers 106 are formed by selectively growing epitaxy layers from the recesses. Specifically, the strained layers 106 are formed within the recesses and extend upwardly along the sidewalls of the corresponding spacers 105. In some embodiments, the strained layers 106 include silicon germanium (SiGe) for a P-type FinFET device. In alternative embodiments, the strained layers 106 include silicon carbon (SiC), silicon phosphate (SiP), SiCP or a SiC/SiP multi-layer structure for an N-type FinFET device. In some embodiments, the strained layers 106 may be optionally implanted with an N-type dopant or a P-type dopant as needed. Following the formation of the strained layers 106, silicide layers may be formed by siliciding the top portions of the strained layers 106.

Still referring to FIG. 2A, a dielectric layer 108 is formed aside or around the dummy strips 104. In some embodiments, the dielectric layer 108 includes carbon-containing oxide, silicate glass, or a suitable dielectric material. In some embodiments, the dielectric layer 108 is made of a single material. In alternative embodiments, the dielectric layer 108 includes a multi-layer structure. The dielectric layer 108 may be filled until its top surface is higher than the top surfaces of the dummy strips 104. A planarization step such as CMP is then performed to remove the excess dielectric layer 108. In some embodiments, a contact etch stop layer (CESL) 107 is formed after the step of forming the strained layers 106 and before the step of forming the dielectric layer 108, and the CESL 107 includes SiN, SiC or the like.

Figure 1B:
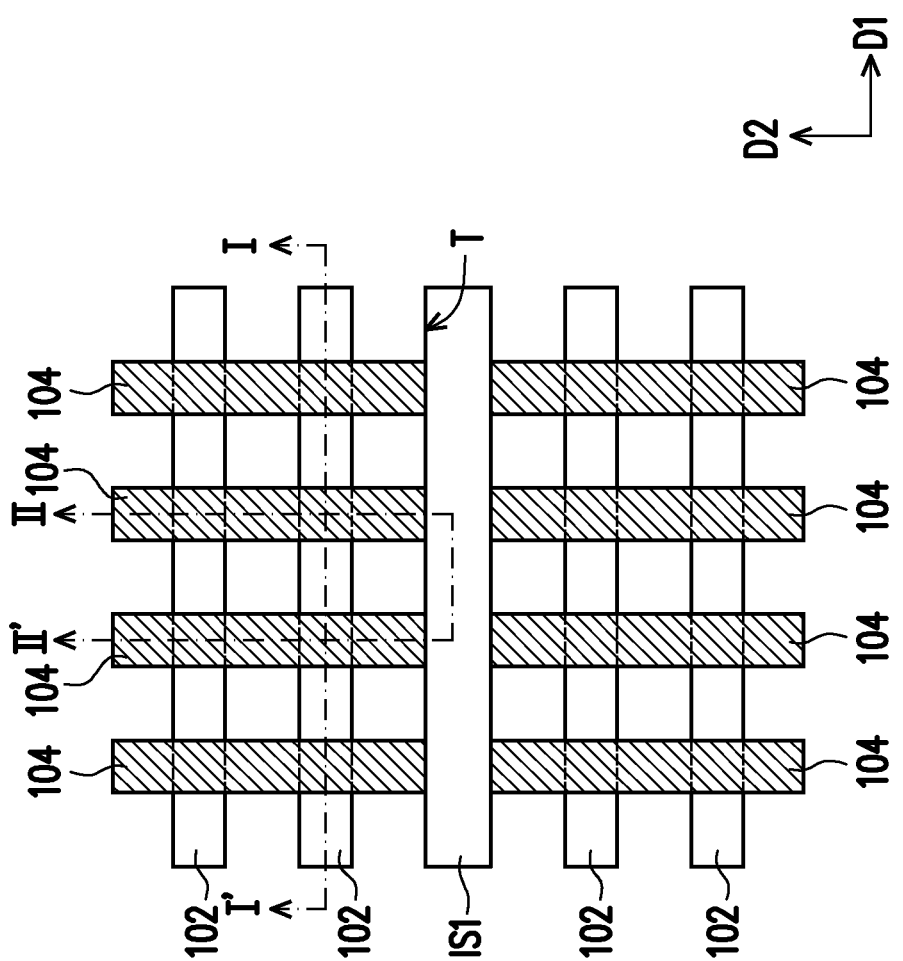
Figure 2B:
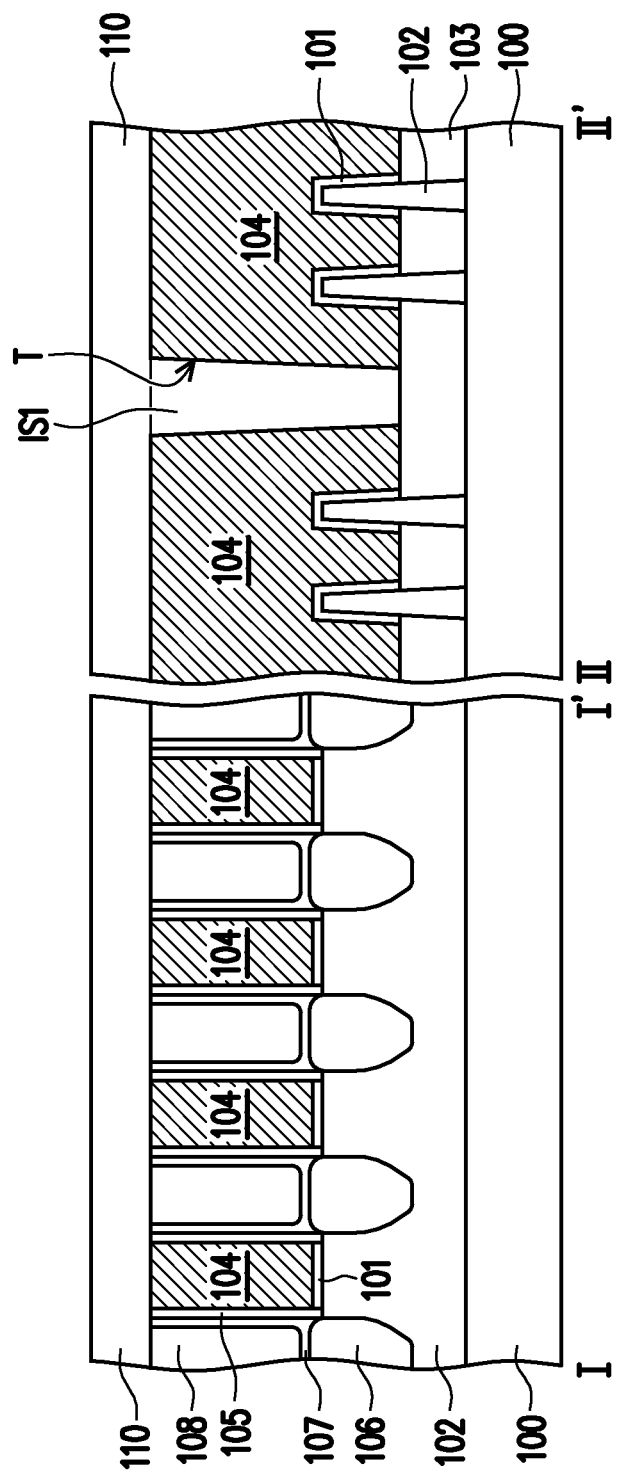

Referring to FIG. 2B, the dummy strips 104 are cut to form a trench T in the dielectric layer 108. In some embodiments, a pattering step is performed to cut off or disconnect the dummy strips 104. The pattering step may include photolithography etching processes. In some embodiments, the trench T extends in the first direction D1, as shown in FIG. 1B.

Thereafter, a first insulating structure IS1 is formed in the trench T. In some embodiments, an insulating layer 110 is formed over the dummy strips 104 and the dielectric layer 108 and fills in the trench T, and the portion of the insulating layer 110 within the trench T constitutes the first insulating structure IS1. In some embodiments, the first insulating structure IS1 is referred to as a "cut poly off" (CPO) layer. In some embodiments, the first insulating structure IS1 extends in the first direction D1, as shown in FIG. 1B. In some embodiments, the insulating layer 110 includes silicon oxide, silicon nitride or a suitable insulating material, and the forming method thereof includes performing a suitable deposition process such as chemical vapor deposition (CVD), physical vapor deposition (PVD) or atomic layer deposition (ALD). In some embodiments, the insulating layer 110 is made of a single material. In alternative embodiments, the insulating layer 110 includes a multi-layer structure.

Upon the formation of the trench T or the first insulating structure IS1, first and second groups of the dummy strips 104 are provided beside the trench T or the first insulating structure IS1, as shown in FIG. 1B. In some embodiments, the dummy strips 104 in the first group and the dummy strips 104 in the second group are arranged end to end and at opposite sides of the first insulating structure IS1. In some embodiments, the facing ends of the dummy strips 104 in the first group are in physical contact with the first insulating structure IS1, and the facing ends of the dummy strips 104 in the second group are in physical contact with the first insulating structure IS1.

Referring to FIG. 2C to FIG. 2F, a dummy strip 104 is removed from the first group of the dummy strips 104 to form a first opening OP1 that exposes portions of the fins 102 under the dummy strip 104.

Figure 2C:
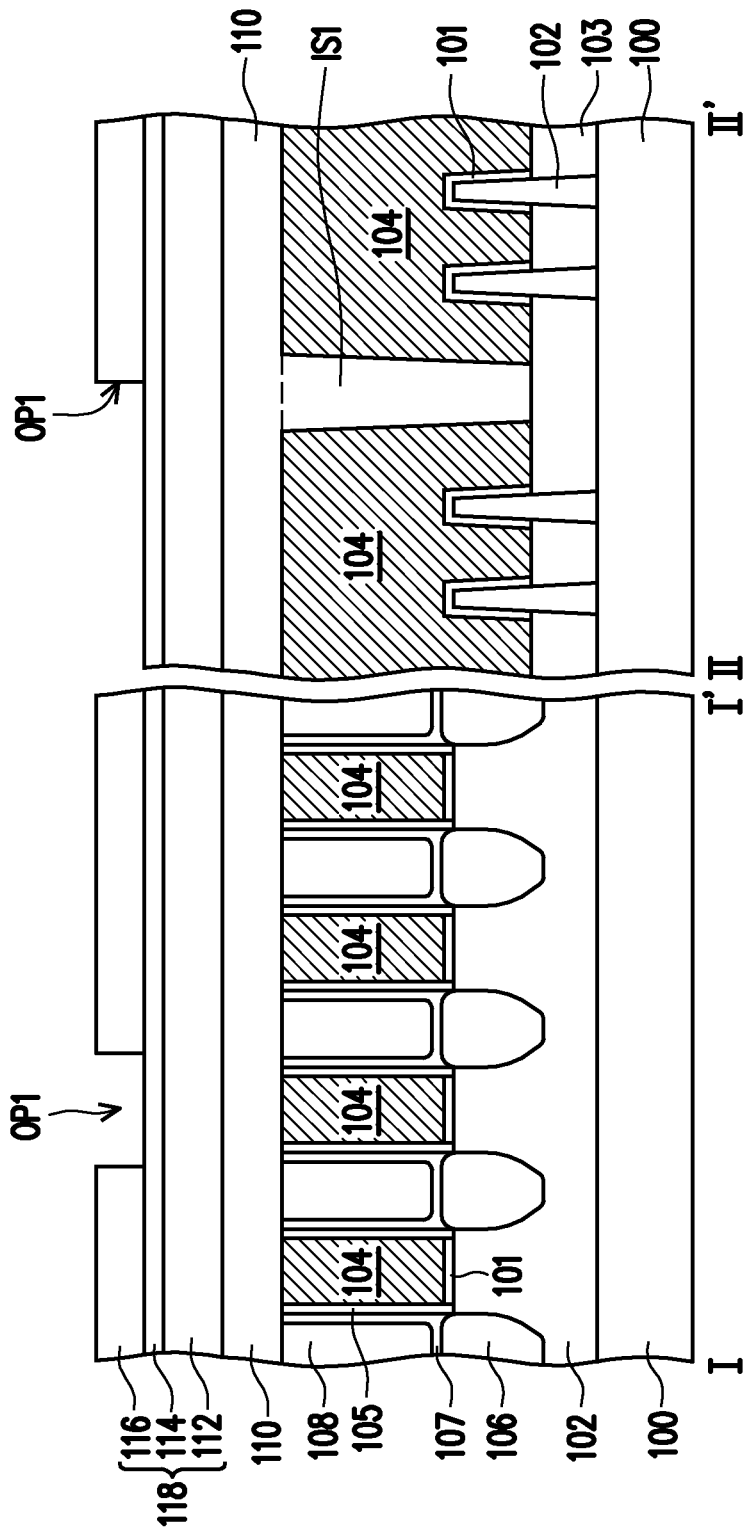
Figure 2D:
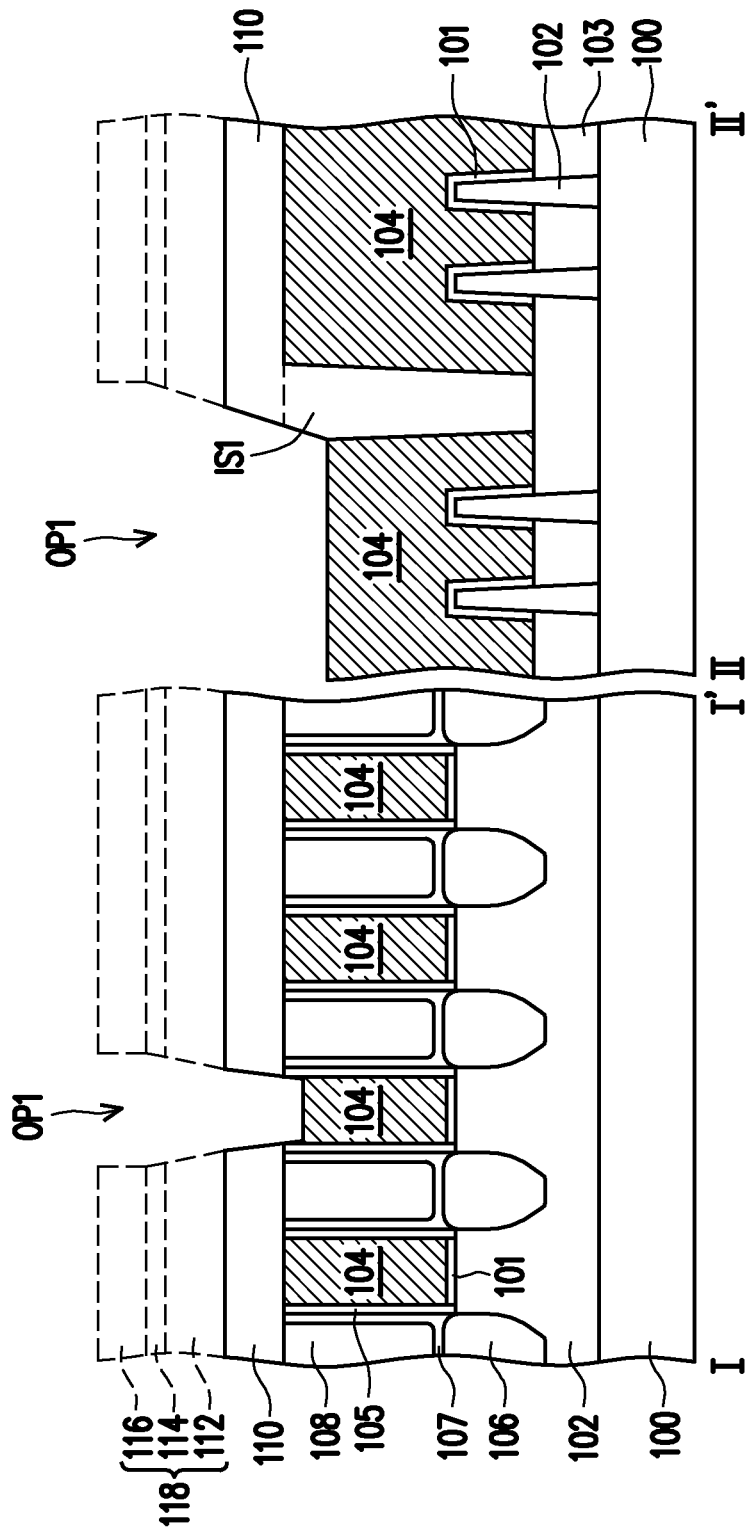

In some embodiments, as shown in FIG. 2C, a tri-layer mask layer 118 is formed on the insulating layer 110. In some embodiments, the tri-layer mask layer 118 includes a bottom layer 112, a middle layer 114 such as a silicon containing hard-mask layer above the bottom layer 112, and a photoresist layer 116 above the middle layer 114. In some embodiments, as shown in FIG. 2C and FIG. 2D, a first opening OP1 is defined in the photoresist layer 116, and the opening pattern of the photoresist layer 116 is sequentially transferred to the middle layer 114, the bottom layer 112, then to the insulating layer 110, until the dummy strip 104 corresponding to the first opening OP1 is exposed. From another point of view, a first opening OP1 is defined in the photoresist layer 116, and the first opening OP1 is deepened until the underlying dummy strip 104 is exposed. In some embodiments, the method of deepening the first opening OP1 includes performing one or more etching processes.

Figure 2E:
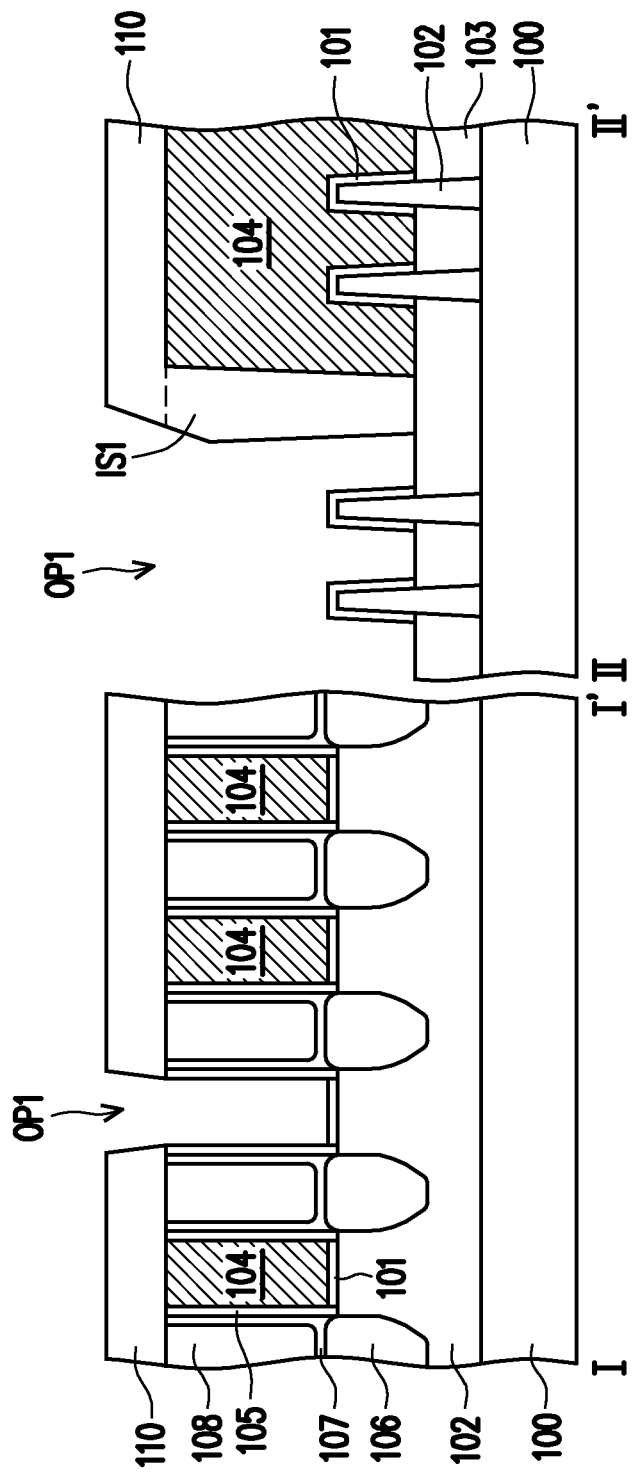

Afterwards, as shown in FIG. 2E, the first opening OP1 is further deepened, until the dummy strip 104 exposed by the first opening OP1 is removed. In some embodiments, an etching process is performed to remove the exposed dummy strip 104, until the underlying interfacial layers 101 are exposed.

Figure 2F:
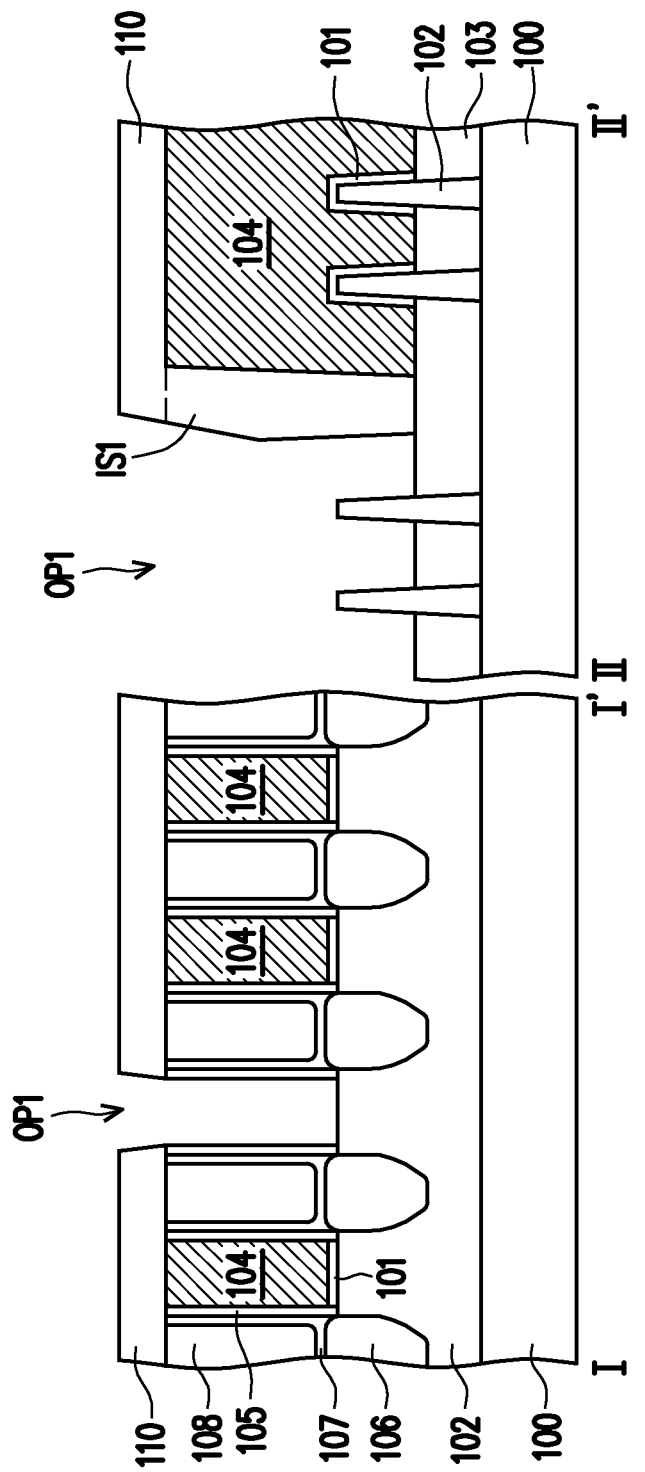

Then, as shown in FIG. 2F, the first opening OP1 is further deepened, until the interfacial layers 101 exposed by the first opening OP1 are removed. In some embodiments, an etching process is performed to remove the exposed interfacial layers 101, until the underlying fins 102 are exposed.

Figure 2G:
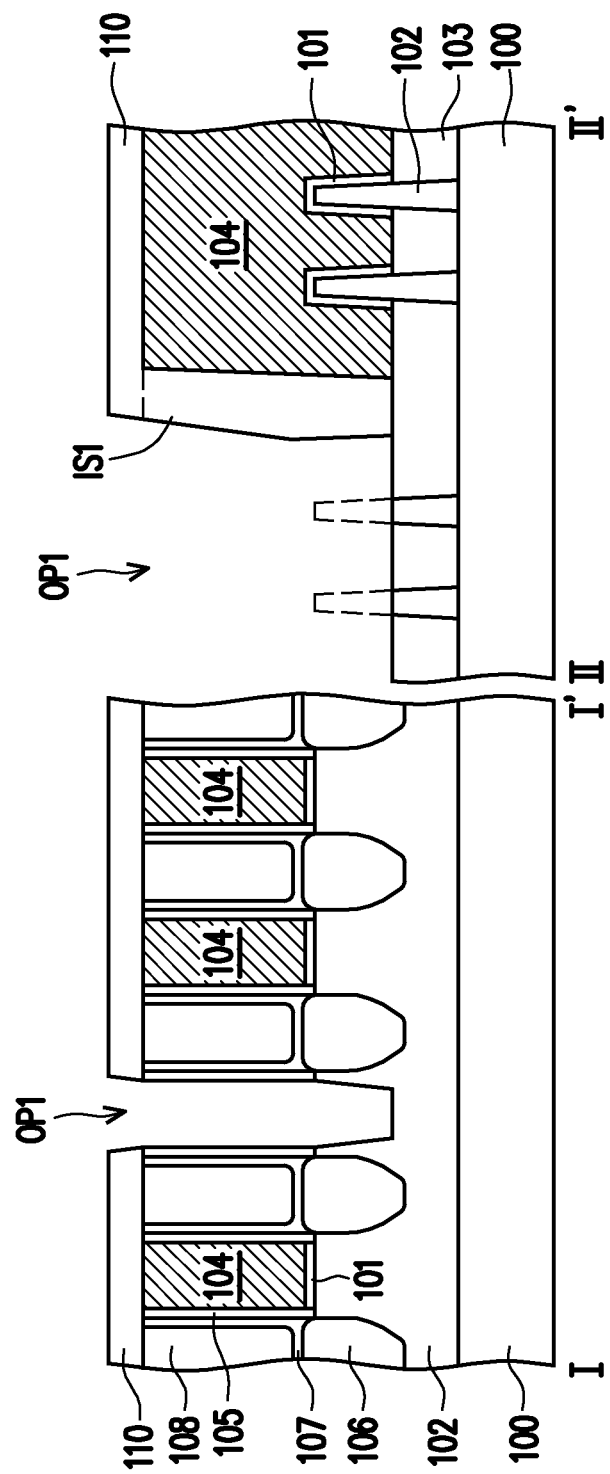
Figure 2H:
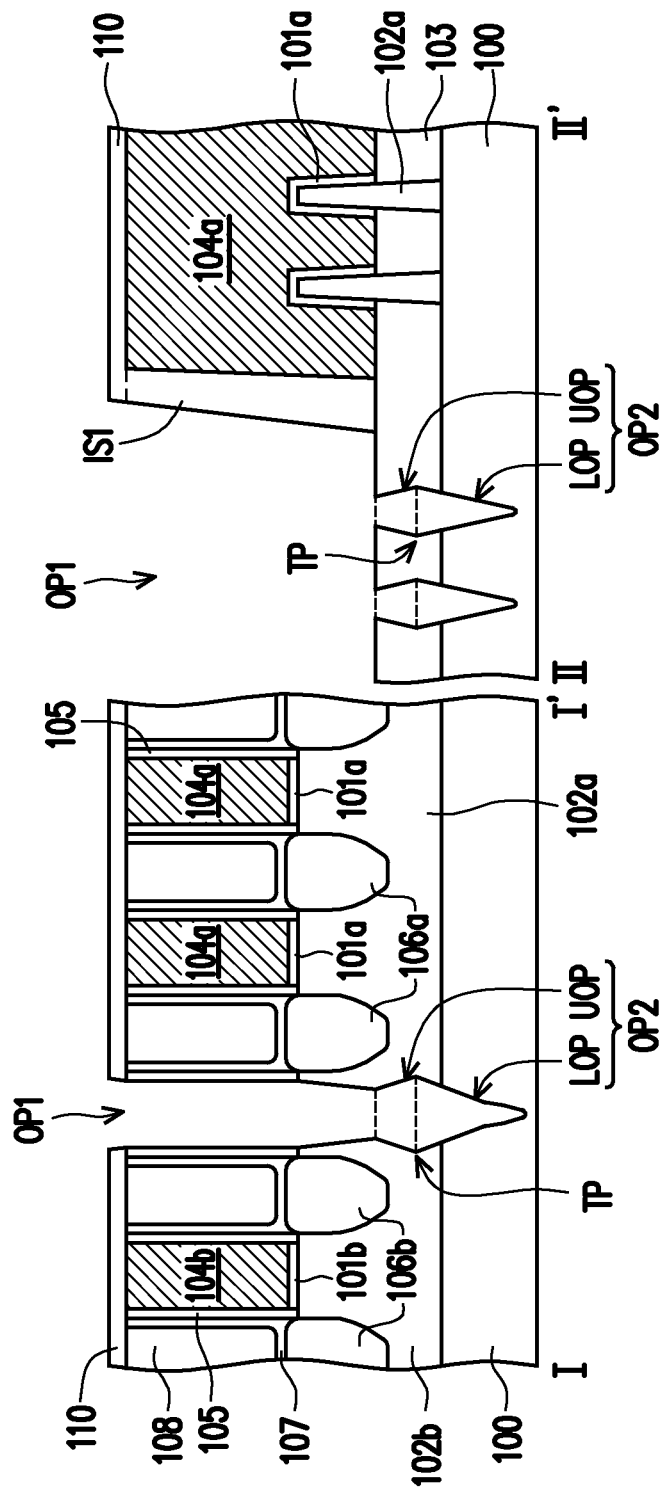
Figure 21:
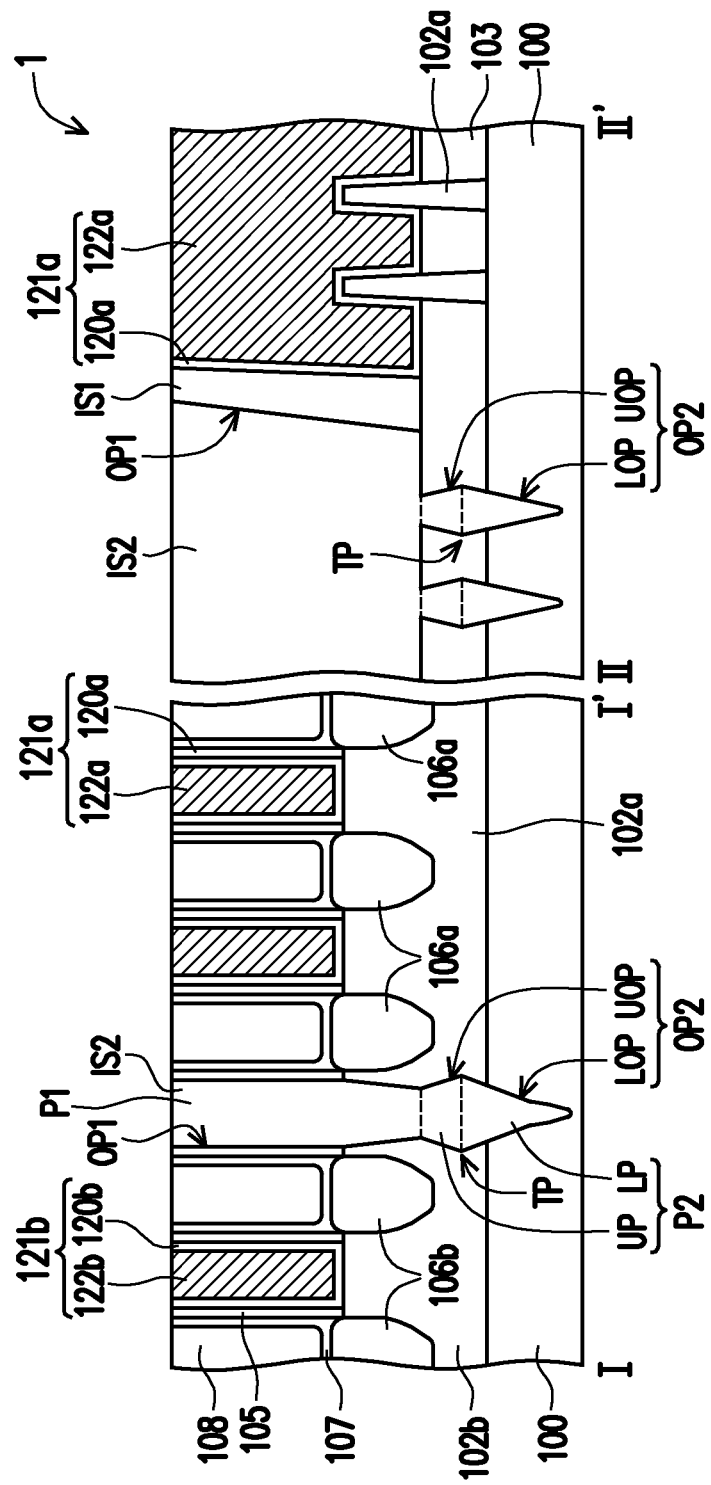

Referring to FIG. 2G and FIG. 2H, the portions of the fins 102 are removed to form a plurality of second openings OP2 below the first opening OP1.

In some embodiments, as shown in FIG. 2G, a first etching step is performed to remove upper parts of the portions of the fins 102 exposed by the first opening OP1 and uncovered by the isolation layer 103. After the first etching step, the first opening OP1 is formed with an inclined sidewall and a substantially flat bottom, and the lower sidewall of the first opening OP1 is away from the adjacent strained layers 106.

In some embodiments, the first etching step is carried out using HBr and $O_2$ etching chemistry, in which the etching conditions include a plasma pressure of from about 10 mT to about 100 mT, an RF source power of about 300 W to about 2,000 W and an RF bias power of about 200 V to about 1,000 V.

Thereafter, as shown in FIG. 2H, a second etching step is performed to at least remove lower parts of the portions of the fins 102 exposed by the first opening OP1. Specifically, the second etching step not only removes the remaining parts of the portions of the fins 102 below the first opening OP1, but also removes a portion of the underlying substrate 100. In some embodiments, the second etching step includes a recess etching step for removing most of the fin portions below the first opening OP1, and a dehorning etching step for removing the residual fin portions not removed by the recess etching step. The dehorning etching step is to depth and widen the recess formed in the recess etching step. In some embodiments, the recess etching step is carried out using HBr and $O_2$ etching chemistry, in which the etching conditions include a plasma pressure of from about 10 mT to about 100 mT, an RF source power of about 300 W to about 2,000 W and an RF bias power of about 200 V to about 1,000 V. In some embodiments, the dehorning etching step is carried out using $SF_6$ and Ar etching chemistry, in which the etching conditions include a plasma pressure of from about 10 mT to about 100 mT, an RF source power of about 200 W to about 800 W and an RF bias power of about 0 V to about 100 V.

In some embodiments, the first and second etching steps are performed in the same process chamber. In alternative embodiments, the first and second etching steps can be performed in different process chambers as needed.

In some embodiments, upon the steps of FIG. 2G and FIG. 2H, each of the second openings OP2 is formed with a middle-wide profile. In some embodiments, each of the second openings OP2 has a diamond shape. For example, each of the second openings OP2 has a tapered upper opening UOP and a tapered lower opening LOP with a turning point TP therebetween. The second openings OP2 may have a maximum width at the intersection of the tapered upper opening UOP and the tapered lower opening LOP. In some embodiments, the maximum width of the second openings OP2 is no less than (e.g., greater than) the maximum width of the fins 102. Specifically, the second openings OP2 are shaped in such a way that the portions of the fins 102 exposed by the first opening OP1 can be completely removed. In some embodiments, the diamond-like second openings OP2 are configured to cut off or disconnect the fins 102 and therefore to fully isolate the devices at opposite sides of the second openings OP2.

Figure 3:
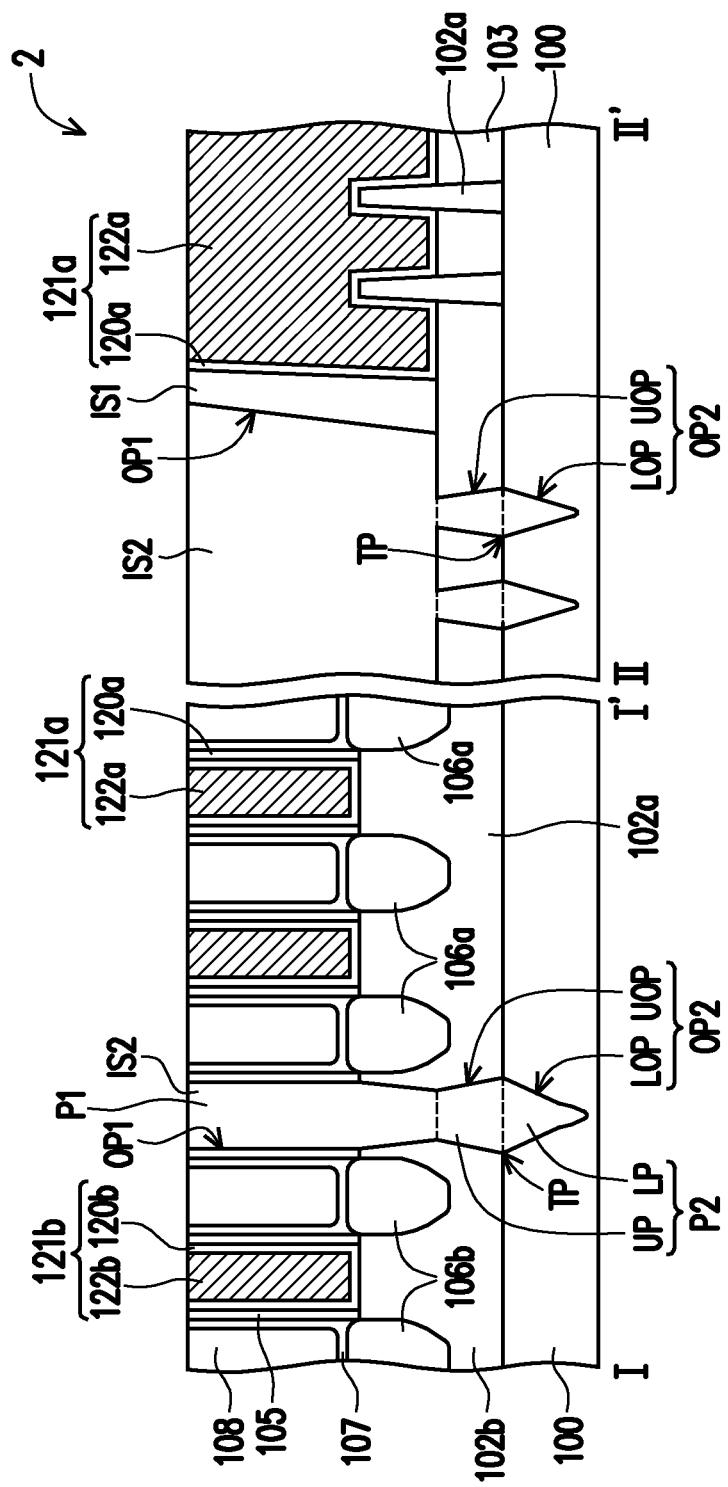
FIG. 3 to FIG. 7 are cross-sectional views of FinFET devices in accordance with alternative embodiments.
Figure 4:
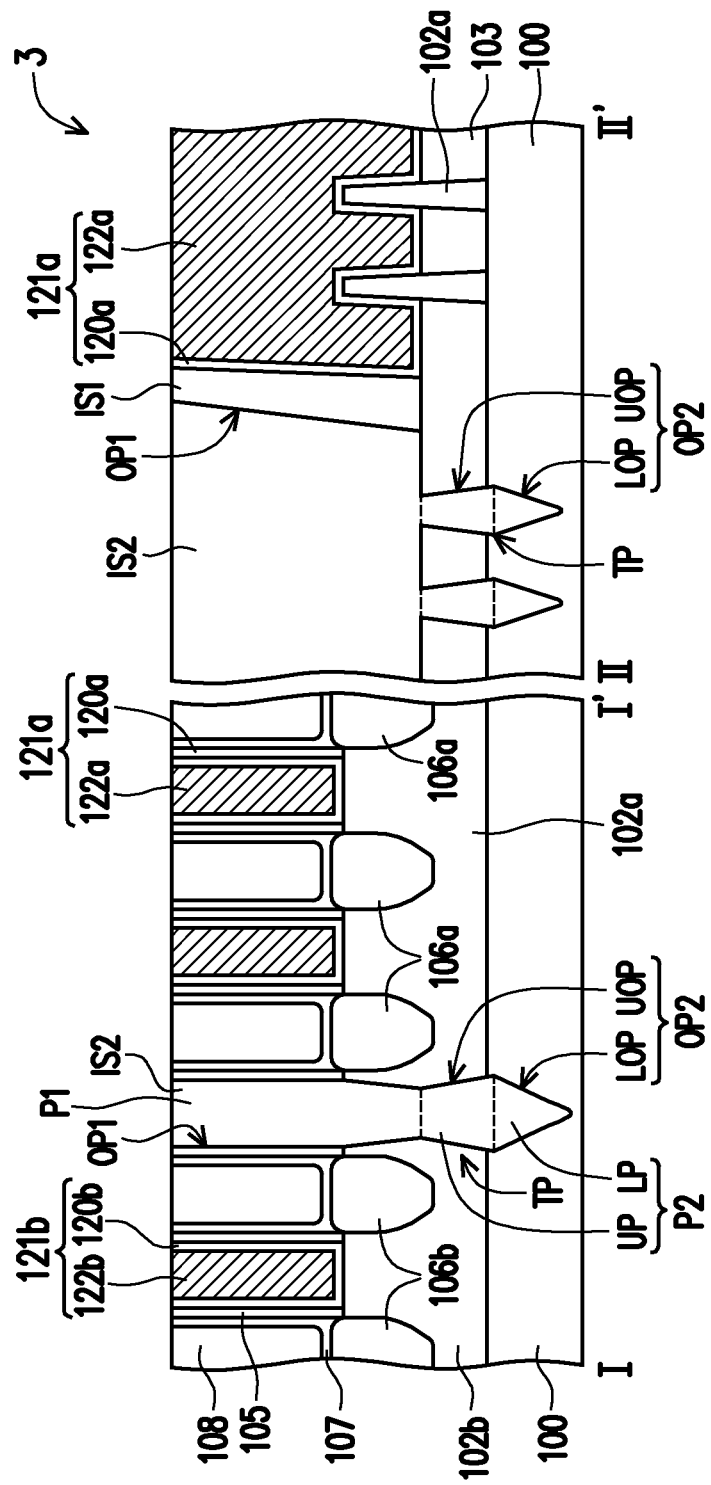

The turning point TP of each second opening OP2 may be around the interface between the isolation layer 103 and the substrate 100. In some embodiments, the turning point TP of each second opening OP2 is above the interface between the isolation layer 103 and the substrate 100, as shown in FIG. 2H. However, the present disclosure is not limited thereto. In alternative embodiments, the turning point TP of each second opening OP2 is at the interface between the isolation layer 103 and the substrate 100, as shown in FIG. 3. In yet alternative embodiments, the turning point TP of each second opening OP2 is below the interface between the isolation layer 103 and the substrate 100, as shown in FIG. 4. The turning points TP of the second openings OP2 are not necessary to be at the same level.

Referring to FIG. 2I, a second insulating structure IS2 is formed in the first opening OP1 and in the second openings OP2. In some embodiments, the method of forming the second insulating structure IS2 includes forming an insulating layer that covers the dummy strips and the dielectric layer 108 and fills in the first and second openings OP1 and OP2. In some embodiments, the insulating layer includes silicon oxide, silicon nitride or a suitable insulating material, and the forming method thereof includes performing a suitable deposition process such as chemical vapor deposition (CVD), physical vapor deposition (PVD) or atomic layer deposition (ALD). Thereafter, a portion of the insulating layer is removed with chemical mechanical polishing (CMP) and/or etching back until the dummy strips are exposed. In some embodiments, the second insulating structure IS2 is referred to as a "cut poly on OD edge" (CPODE) layer. In some embodiments, the second insulating structure IS2 is made of a single material. In alternative embodiments, the second insulating structure IS2 includes a multi-layer structure.

Since the second insulating structure IS2 is formed in the first and second openings OP1 and OP2, the second insulating structure IS2 has a shape/profile similar to that of the combined shape/profile of the first and second openings OP1 and OP2. In some embodiments, the second insulating structure IS2 has a main part P1 within the first opening OP1 and multiple protruding parts P2 within the second openings OP2. In some embodiments, each of the protruding parts P2 is formed with a middle-wide profile. In some embodiments, each of the protruding parts P2 has a diamond shape. For example, each of the protruding parts P2 has a tapered upper portion UP and a tapered lower portion LP with a turning point TP therebetween. The protruding parts P2 may have a maximum width at the intersection of the tapered upper portion UP and the tapered lower portion LP. In some embodiments, the maximum width of the protruding parts P2 is no less than (e.g., greater than) the maximum width of the fins.

The turning point TP of each protruding part P2 may be around the interface between the isolation layer 103 and the substrate 100. In some embodiments, the turning point TP of each protruding part P2 is above the interface between the isolation layer 103 and the substrate 100, as shown in FIG. 2I. However, the present disclosure is not limited thereto. In alternative embodiments, the turning point TP of each protruding part P2 is at the interface between the isolation layer 103 and the substrate 100, as shown in FIG. 3. In yet alternative embodiments, the turning point TP of each protruding part P2 is below the interface between the isolation layer 103 and the substrate 100, as shown in FIG. 4. The turning points TP of the protruding parts P2 are not necessary to be at the same level.

Figure 5:
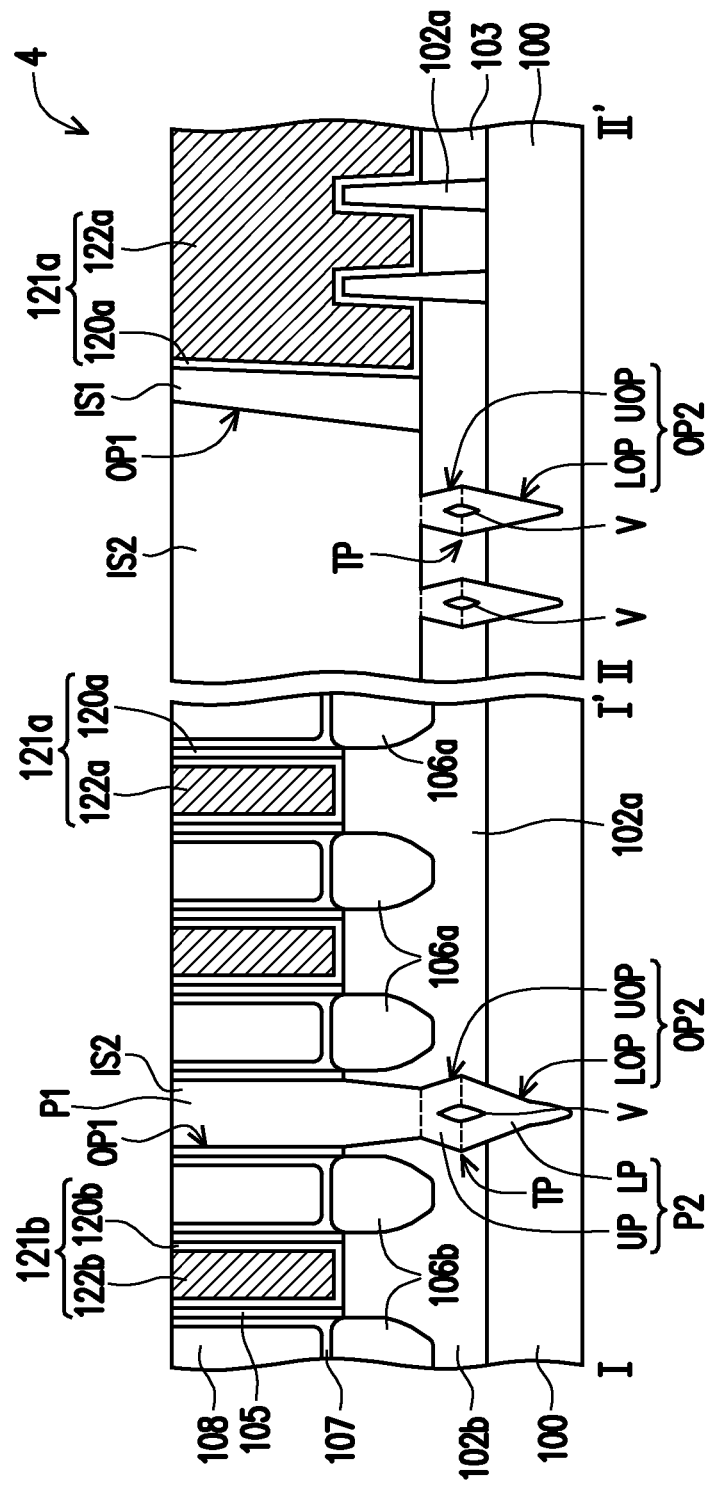
Figure 6:
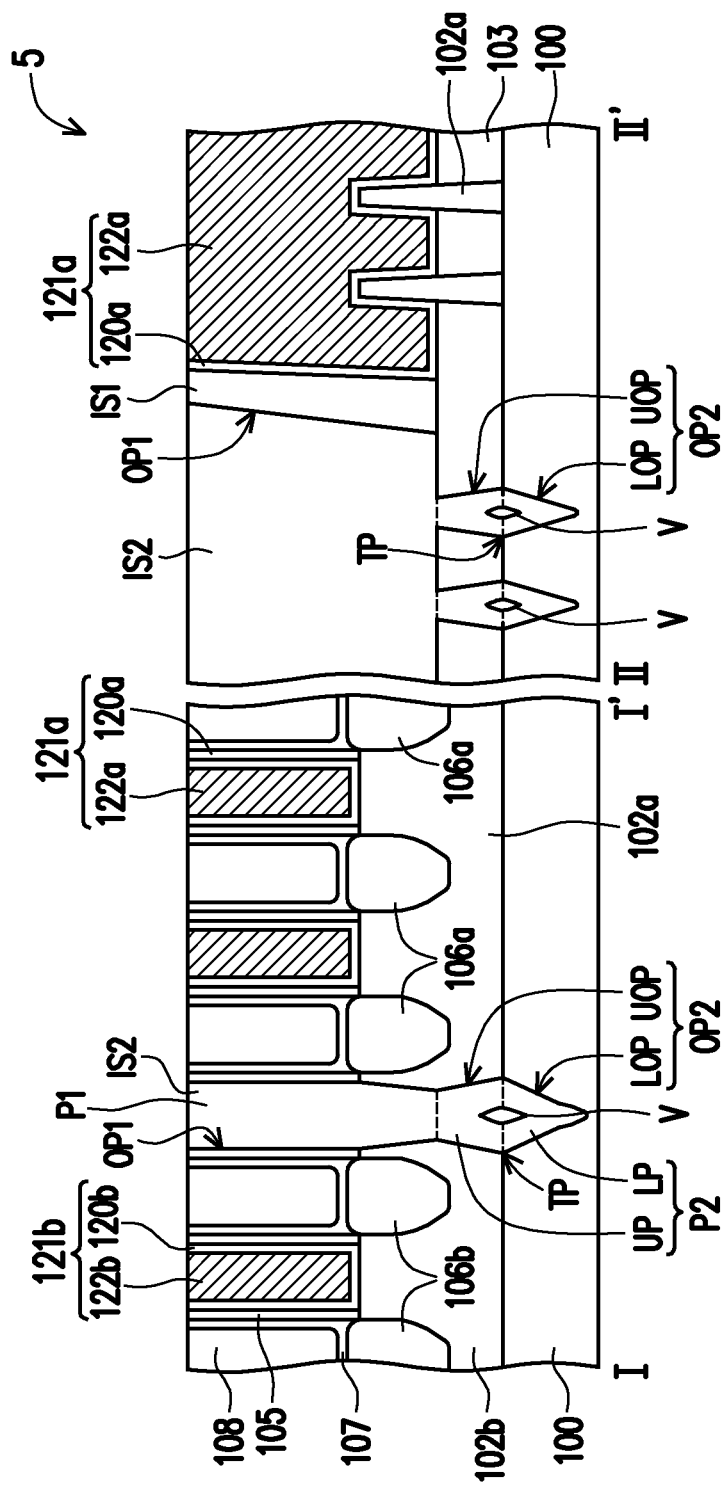
Figure 7:
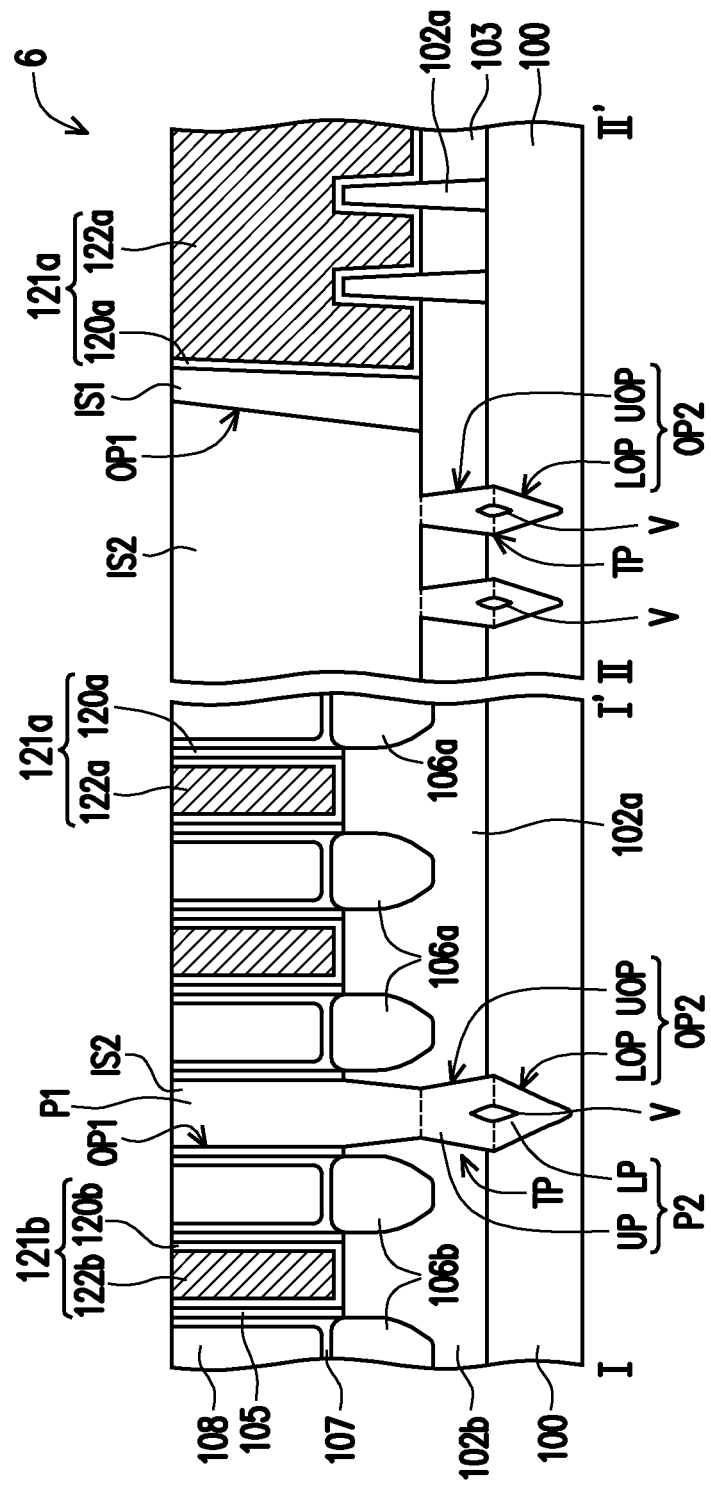

In some embodiments, the second insulating structure IS2 is a void-free insulating structure, as shown in FIG. 2I and FIGS. 3-4. However, the present disclosure is not limited thereto. In alternative embodiments, at least some of the main part P1 and the protruding parts P2 of the second insulating structure IS2 have voids V or air gaps therein, as shown in FIGS. 5-7.

Figure 1C:
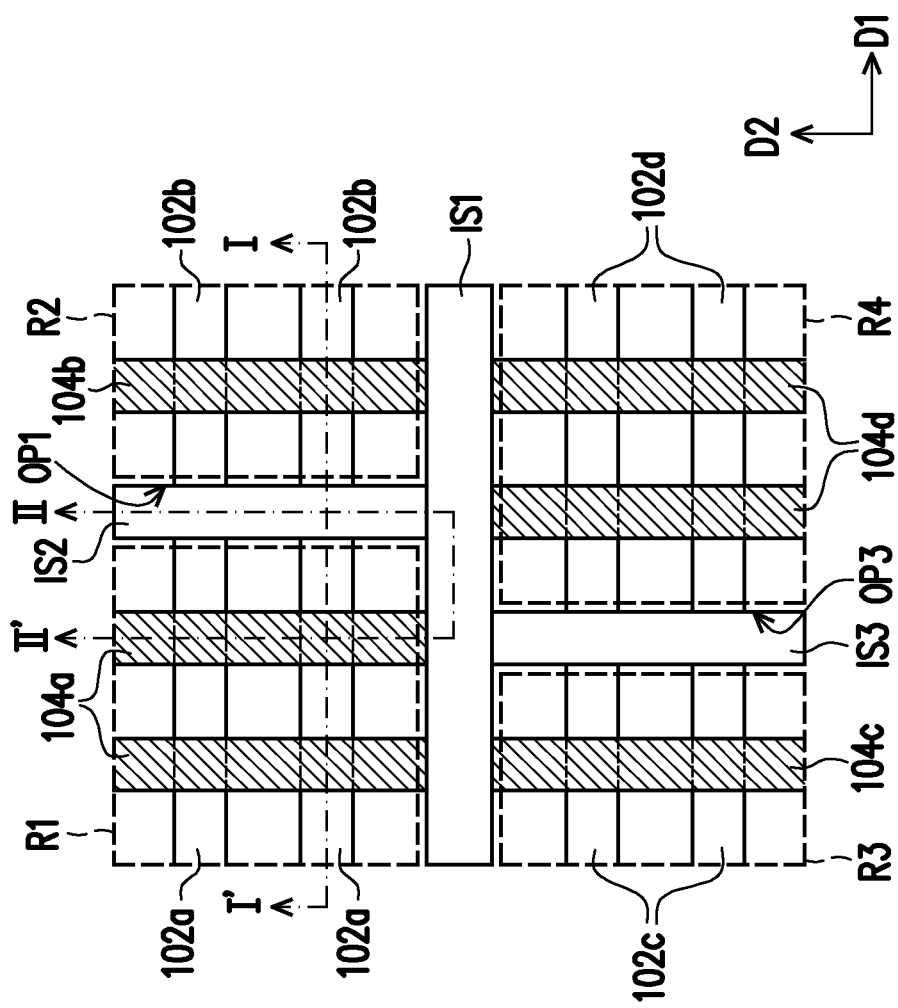

In some embodiments, during the step of forming the first opening OP1, another dummy strip 104 is removed from the second group of the dummy strips 104 to form a third opening OP3 that exposes the fins 102 under the another dummy strip 104, as shown in FIG. 1C. In some embodiments, the third opening OP3 has a profile similar to that of the opening OP1. In some embodiments, the first opening OP1 is not aligned to the third opening OP3, as shown in FIG. 1C. However, the present disclosure is not limited thereto. In alternative embodiments, the first opening OP1 can be aligned to the third opening OP3 as needed.

In some embodiments, during the step of forming the second openings OP2, the fins 104 exposed by the third opening OP3 are removed to form a plurality of fourth openings below the third opening OP3. In some embodiments, the fourth openings have a profile similar to that of the second openings OP2. In some embodiments, each of the fourth openings has a middle-wide profile such as a diamond shape profile.

In some embodiments, during the step of forming the second insulating structure IS2 in the first and second openings OP1 and OP2, a third insulating structure IS3 is formed in the third and fourth openings, as shown in FIG. 1C. In some embodiments, the second insulating structure IS2 and the third insulating structure IS3 are both in physical contact with the first insulating structure IS1.

In some embodiments, the first group of the dummy strips 104 (as shown in FIG. 1B) is divided into first and second subgroups of the dummy strips (e.g., first and second dummy strips 104a and 104b as shown FIG. 1C) after the first and second openings are formed. Similarly, the second group of the dummy strips 104 (as shown in FIG. 1B) is divided into third and fourth subgroups of the dummy strips (e.g., third and fourth dummy strips 104c and 104d as shown FIG. 1C) after the third and fourth openings are formed. In some embodiments, as shown in FIG. 1C, first to four regions R1 to R4 are defined upon the formation of the first to fourth openings, and first to fourth dummy strips 104a to 104d are respectively provided in the first to fourth regions R1 to R4. Similarly, the interfacial layers in the first to fourth regions R1 to R4 can be referred to as first to fourth interfacial layers 101a to 101d, the fins in the first to fourth regions R1 to R4 can be referred to as first to fourth fins 102a to 102d, and the strained layers in the first to fourth regions R1 to R4 can be referred to as first to fourth strained layers 106a to 106d.

Referring to FIG. 2I, the first and second subgroups of the dummy strips (e.g., first and second dummy strips 104a and 104b) are replaced with first and second gate strips 121a and 121b. In some embodiments, the first and second dummy strips 104a and 104b are removed to form gate trenches in the dielectric layer 108, and the first and second gate strips 121a and 121b are filled in the gate trenches.

Figure 1D:
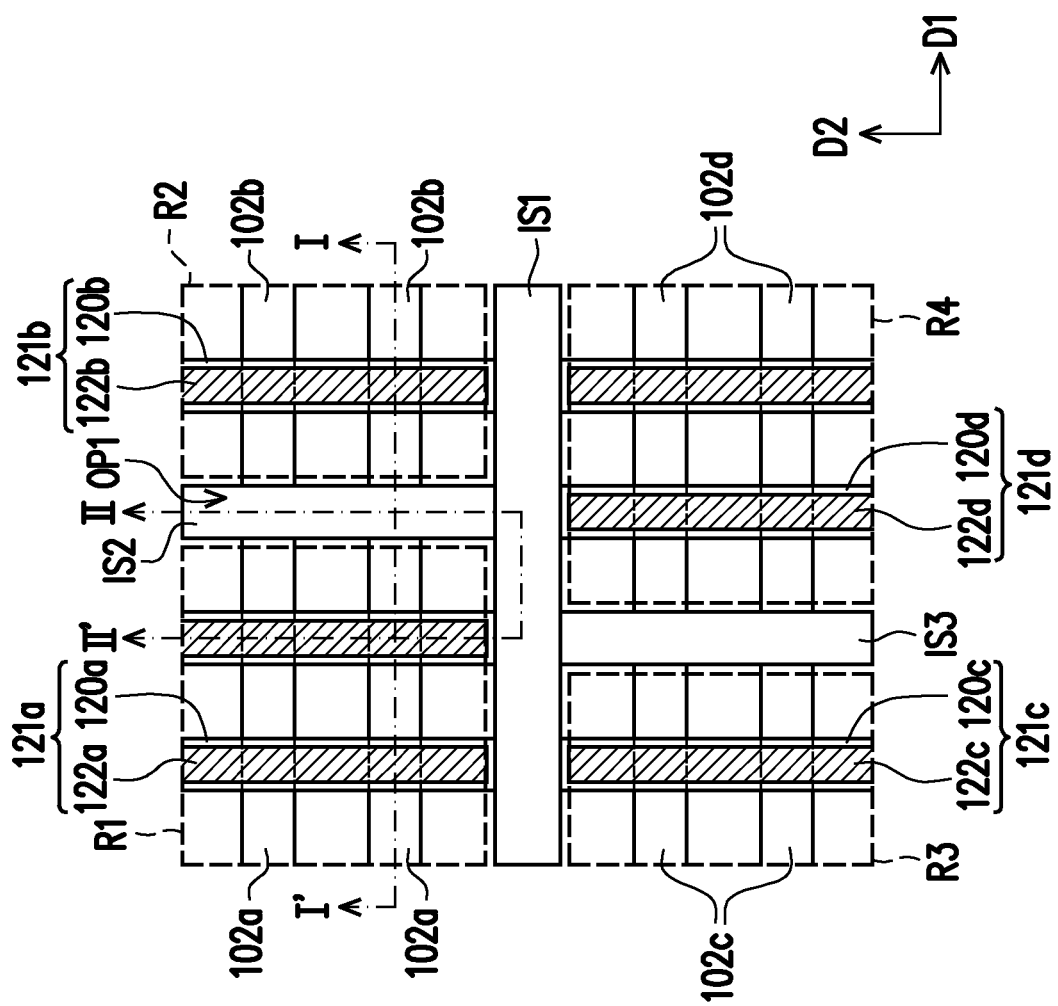

In some embodiments, the first and second gate strips 121a and 121b extend in the second direction D2, as shown in FIG. 1D. In some embodiments, each first gate strip 121a includes a first gate dielectric layer 120a and a first gate 122a on the first gate dielectric layer 120a, and each second gate strip 122b includes a second gate dielectric layer 120b and a second gate 122b on the second gate dielectric layer 120b. In some embodiments, the first gate dielectric layer 120a surrounds the sidewall and bottom of the corresponding first gate 122a and on the tops and sidewalls of the corresponding first fins 102a, and the second gate dielectric layer 120b surrounds the sidewall and bottom of the corresponding second gate 122b and on the tops and sidewalls of the corresponding second fins 102b.

In some embodiments, each of the first and second gate dielectric layers 120a and 120b includes a high-k material having a dielectric constant greater than about 10. In some embodiments, the high-k material includes metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, a combination thereof, or a suitable material. In alternative embodiments, each of the first and second gate dielectric layers 120a and 120b can optionally include a silicate such as HfSiO, LaSiO, AlSiO, a combination thereof, or a suitable material. In some embodiments, each of the first and second gates 122a to 122b includes a work function metal layer and a fill metal layer on the work function metal layer. The work function metal layer is an N-type work function metal layer or a P-type work function metal layer. In some embodiments, the N-type work function metal layer includes TiAl, TiAlN, or TaCN, conductive metal oxide, and/or a suitable material. In alternative embodiments, the P-type work function metal layer includes TiN, WN, TaN, conductive metal oxide, and/or a suitable material. The fill metal layer includes copper, aluminum, tungsten, or a suitable material. In some embodiments, each of the first and second gates 122a to 122b can further include a liner layer, an interface layer, a seed layer, an adhesion layer, a barrier layer, a combination thereof or the like.

In some embodiments, the metal layers included in the first and second gate strips 121a and 121b have the same work function. In some embodiments, the metal layers included in the first and second gate strips 121a and 121b have different work functions.

In some embodiments, during the step of replacing first and second dummy strips 104a and 104b with the first and second gate strips 121a and 121b, the third and fourth dummy strips 104c and 104d are replaced with third and fourth gate strips 121c and 121d, as shown in FIG. 1C and FIG. 1D. In some embodiments, each third gate strip 121c includes a third gate dielectric layer 120c and a third gate 122c on the third gate dielectric layer 120c, and each fourth gate strip 122d includes a fourth gate dielectric layer 120d and a forth gate 122d on the second gate dielectric layer 120b. In some embodiments, the third and fourth gate strips 121c and 121d include metal layers with the same work function. In some embodiments, the third and fourth gate strips 121c and 121d include metal layers with different work functions. The FinFET device of the present disclosure is thus completed.

The structures of the FinFET devices of the present disclosure are illustrated below with reference to FIG. 1D, FIG. 2I and FIGS. 3-7.

In some embodiments, the FinFET device 1/2/3/4/5/6 includes a plurality of first fins 102a, a plurality of second fins 102b, an isolation layer 103, a first gate strip 121a, a second gate strip 121b, a first insulating structure IS1 and a second insulating structure IS2. The first fins 102a and the second fins 102b are disposed on a substrate 100. The isolation layer 103 is disposed on the substrate 100 and covers lower portions of the first fins 102a and the second fins 102b. The first gate strip 121a is disposed across the first fins 102a. The second gate strip 121b is disposed across the second fins 102b. The first insulating structure IS1 is in physical contact with the first and second gate strips 121a and 121b. For example, the first insulating structure IS1 is in physical contact with the first and second gate dielectric layers 120a and 120b of the first and second gate strips 121a and 121b.

In some embodiments, the second insulating structure IS2 is in physical contact with the first insulating structure IS1. In some embodiments, the second insulating structure IS2 is in physical contact with the first fins 102a and the second fins 102b. The second insulating structure IS2 is disposed between the first gate strip 121a and the second gate strip 121b and has a main part P1 located above a top surface of the isolation layer 103 and a plurality of protruding parts P2 located below the top surface of the isolation layer 103. In some embodiments, each of the protruding parts P2 has a middle-wide profile such as a diamond shape profile. In some embodiments, the main part P1 of the second insulating structure IS2 has an inclined sidewall. In some embodiments, each of the protruding parts P2 of the second insulating structure IS2 has a tapered bottom. For example, at least one of the protruding parts P2 of the second insulating structure IS2 has a tapered bottom tip with a rounded cone shape.

In some embodiments, each of the protruding parts P2 of the second insulating structure IS2 has a turning point TP around an interface between the substrate 100 and the isolation layer 103. Specifically, the turning point TP of each protruding part P2 can be at a level above, equal to or below the interface between the isolation layer 103 and the substrate 100, as shown in FIG. 2I, FIG. 3 and FIG. 4.

In some embodiments, the FinFET device 1/2/3/4/5/6 further includes first strained layers 106a in the first fins 102a and aside the first gate strip 121a, and second strained layers 106b in the second fins 102b and aside the second gate strip 121b. In some embodiments, the main part P1 of the second insulating structure IS2 has an inclined sidewall away from the adjacent first strained layer 106a or the adjacent second strained layer 106b. In some embodiments, the turning points TP of the protruding parts P2 of the second insulating structure IS2 are at a level below bottoms of the first and second strained layers 106a and 106b. In some embodiments, the maximum width of the protruding parts P2 is no more than (e.g., greater than) the maximum width of the first fins 102a or the second fins 102b.

In some embodiments, the FinFET device 1/2/3/4/5/6 further includes a plurality of third fins 102c, a plurality of fourth fins 102d, a third gate strip, a fourth gate strip and a third insulating structure IS3. The third fins 102c and the fourth fins 102d are disposed on the substrate 100. The third gate strip 121c is disposed across the third fins 102c. The fourth gate strip 121d is disposed across the fourth fins 102d. The third insulating structure IS3 is disposed between the third gate strip 121c and the fourth gate strip 121d and has a profile/shape similar to that of the second insulating structure IS2.

The first insulating structure IS1 is in physical contact with the third and fourth gate strips 121c and 121d. For example, the first insulating structure IS1 is in physical contact with the third and fourth gate dielectric layers 120c and 120d of the first and second gate strips 121c and 121d. In some embodiments, the third insulating structure IS3 is in physical contact with the first insulating structure IS1. In some embodiments, the third insulating structure IS3 is in physical contact with the third fins 102c and the fourth fins 102d.

In some embodiments, the second insulating structure IS2 and/or the third insulating structure IS3 is a void-free insulating structure, as shown in FIG. 2I and FIGS. 3-4. In alternative embodiments, at least some of the main part and the protruding parts of the second insulating structure IS2 and/or the third insulating structure IS3 have voids V or air gaps therein, as shown in FIGS. 5-7. For example, at least one of the second insulating structure IS2 and the third insulating structure IS3 has voids V within the protruding parts thereof.

From another point of view, the second insulating structure IS2 can be referred to as a comb-like insulating structure. The comb-like insulating structure is disposed between the first gate strip 121a and the second gate strip 121b. In some embodiments, the comb-like insulating structure has a comb shaft part (e.g., main part P1) and a plurality of comb tooth parts (e.g., extending parts P2) extending downwardly from the comb shaft part thereof. The comb shaft part (e.g., main part P1) is parallel to the first and second gate strips 121a and 121b and connected to the comb tooth parts (e.g., extending parts P2). In some embodiments, each of the comb tooth parts has a middle-wide profile such as a diamond shape profile. In some embodiments, the third insulating structure IS3 can have a comb-like insulating structure similar to that of the second insulating structure IS2. In some embodiments, the first insulating structure IS1 can be designed to have a comb-like insulating structure as needed.

In view of the above, with the method of the present disclosure, an isolation structure such as a CPODE layer is formed with excellent physical and electrical isolation between two closely adjacent gate strips. The isolation structure of the present disclosure has comb tooth parts or protruding parts with a middle-wide profile, and such comb tooth parts or protruding parts respectively penetrate through the underlying fins without fin residues in an extending direction of the isolation structure. By such manner, the leakage current between the closely adjacent gate strips is reduced and the high TDDB (time-dependent dielectric breakdown) characteristic is accordingly achieved.

In accordance with some embodiments of the present disclosure, a FinFET device includes a plurality of first fins, a plurality of second fins, a first gate strip, a second gate strip and a comb-like insulating structure. The first and second fins are disposed on a substrate. The first gate strip is disposed across the first fins. The second gate strip is disposed across the second fins. The comb-like insulating structure is disposed between the first gate strip and the second gate strip and has a plurality of comb tooth parts. In some embodiments, each of the comb tooth parts has a middle-wide profile.

In accordance with alternative embodiments of the present disclosure, a FinFET device includes a plurality of first fins, a plurality of second fins, an isolation layer, a first gate strip, a second gate strip, a first insulating structure and a second insulating structure. The first fins and the second fins are disposed on a substrate. The isolation layer is disposed on the substrate and covers lower portions of the first fins and the second fins. The first gate strip is disposed across the first fins. The second gate strip is disposed across the second fins. The first insulating structure is in physical contact with the first and second gate strips. The second insulating structure is disposed between the first gate strip and the second gate strip and has a main part located above a surface of the isolation layer and a plurality of protruding parts located below the surface of the isolation layer, and each of the protruding parts has a diamond shape.

In accordance with yet alternative embodiments of the present disclosure, a method of forming a FinFET device includes following steps. A substrate is provided with a plurality of fins thereon, an isolation layer thereon covering lower portions of the fins, a plurality of dummy strips across the fins, and a dielectric layer aside the dummy strips. The dummy strips is cut to form a trench in the dielectric layer. A first insulating structure is formed in the trench, wherein first and second groups of the dummy strips are beside the first insulating structure. A dummy strip is removed from the first group of the dummy strips to form a first opening that exposes portions of the fins under the dummy strip. The portions of the fins are removed to form a plurality of second openings below the first opening, wherein each of the second openings has a middle-wide profile. A second insulating structure is formed in the first and second openings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A FinFET device, comprising:
    a plurality of first fins and a plurality of second fins disposed on a substrate;
    a first gate strip disposed across the first fins;
    a second gate strip disposed across the second fins; and
    a comb-like insulating structure disposed between the first gate strip and the second gate strip and having a plurality of comb tooth parts, wherein each of the plurality of comb tooth parts has a middle-wide profile.

2. The FinFET device of claim 1, wherein the comb-like insulating structure further has a comb shaft part parallel to the first and second gate strips and connected to the comb tooth parts thereof.

3. The FinFET device of claim 2, further comprising:
    first strained layers in the first fins and aside the first gate strip; and
    second strained layers in the second fins and aside the second gate strip, wherein the comb shaft part of the comb-like insulating structure has an inclined sidewall away from an adjacent first strained layer or an adjacent second strained layer.

4. The FinFET device of claim 1, further comprising an isolation layer on the substrate and covering lower portions of the first fins and the second fins, wherein the comb tooth parts of the comb-like insulating structure are below a top surface of the isolation layer.

5. The FinFET device of claim 4, wherein each of the comb tooth parts has a tapered upper portion and a tapered lower portion with a turning point therebetween.

6. The FinFET device of claim 5, wherein the turning point is around the interface between the isolation layer and the substrate.

7. The FinFET device of claim 1, wherein the comb-like insulating structure has voids therein.

8. A FinFET device, comprising:
    a plurality of first fins and a plurality of second fins disposed on a substrate;
    an isolation layer disposed on the substrate and covering lower portions of the first fins and the second fins;
    a first gate strip disposed across the first fins;
    a second gate strip disposed across the second fins;
    a first insulating structure in physical contact with the first gate strip and the second gate strip; and
    a second insulating structure disposed between the first gate strip and the second gate strip and having a main part located above a surface of the isolation layer and a plurality of protruding parts located below the surface of the isolation layer, wherein each of the protruding parts has a diamond shape.

9. The FinFET of claim 8, wherein each of the protruding parts of the second insulating structure has a tapered bottom.

10. The FinFET of claim 8, wherein each of the protruding parts of the second insulating structure has a turning point around an interface between the substrate and the isolation layer.

11. The FinFET of claim 8, wherein the second insulating structure has voids within the protruding parts thereof.

12. The FinFET of claim 8, further comprising:
    a plurality of third fins and a plurality of fourth fins disposed on the substrate,
    a third gate strip disposed across the third fins;
    a fourth gate strip disposed across the fourth fins; and
    a third insulating structure disposed between the third gate strip and the fourth gate strip and having a profile similar to a profile of the second insulating structure.

* * * * *